United States Patent [19]
Gamand

[11] Patent Number: 5,635,762
[45] Date of Patent: Jun. 3, 1997

[54] FLIP CHIP SEMICONDUCTOR DEVICE WITH DUAL PURPOSE METALLIZED GROUND CONDUCTOR

[75] Inventor: Patrice Gamand, Douvres, France

[73] Assignee: U.S. Philips Corporation, New York, N.Y.

[21] Appl. No.: 236,973

[22] Filed: May 2, 1994

[30] Foreign Application Priority Data

May 18, 1993 [FR] France ................... 93 05996

[51] Int. Cl.$^6$ .......................... H01L 23/34; H01L 23/48; H01P 1/00
[52] U.S. Cl. .......................... 257/728; 257/778; 257/780; 257/774; 333/246; 333/247
[58] Field of Search ....................... 257/666, 734, 257/737, 738, 728, 777, 778, 780, 774; 333/246, 247

[56] References Cited

U.S. PATENT DOCUMENTS 4,992,764  2/1991  Ayasli ........................... 333/247
5,404,581  4/1995  Hanjo ........................... 257/778

FOREIGN PATENT DOCUMENTS 0469614  2/1992  European Pat. Off. ........ H01L 21/60
0469988  2/1992  European Pat. Off. ........ H01L 23/48

Primary Examiner—Carl W. Whitehead
Attorney, Agent, or Firm—Robert J. Kraus

[57] ABSTRACT

Semiconductor device for the microwave frequency ranges includes a semiconductor element of the "flip chip" type which comprises a semiconductor substrate having an active surface with at least one integrated circuit, a plurality of metal input-output pads and a circuit of transmission lines of the coplanar type having conductor strips and ground metallizations disposed on the active surface. A circuit of transmission lines of the microstrip type with conductor strips disposed on a surface opposed to the active surface and whose ground metallizations are formed by the ground metallization of the active surface. A base plate comprising an insulating substrate having a front surface with a plurality of metal input-output pads and ground metallizations patterned so as to be in electrical contact with the ground metallizations of the active surface of the semiconductor element when the latter is bonded to the base plate. The active surface of the semiconductor element is bonded to the front surface of the base plate with the corresponding input-output pads in electrical contact with one another.

20 Claims, 4 Drawing Sheets

FLIP CHIP SEMICONDUCTOR DEVICE WITH DUAL PURPOSE METALLIZED GROUND CONDUCTOR

FIELD OF THE INVENTION

This invention relates to a semiconductor device for ultra-high frequencies comprising:

- a semiconductor element of the "flip chip" type which comprises a semiconductor substrate of which an active surface has at least one integrated circuit and a plurality of metal input-output pads,
- a base plate which comprises an insulating substrate of which a front surface has a plurality of metal input-output pads,
- and means for fixation of the active surface of the semiconductor element on the front surface of the base plate, with the corresponding input-output pads in electrical contact with one another.

The expression "semiconductor element of the flip chip type" should be understood to mean an element comprising a semiconductor substrate of which an active surface comprises an integrated circuit and input-output pads and which is fixed on a front surface of an insulating support, called a base plate, having corresponding input-output pads.

In the flip chip arrangement, the semiconductor substrate is turned over for its fixation on the base plate so that its active surface faces the front surface of the base plate, and so that its surface opposed to the active surface becomes the upper surface of the semiconductor device. An advantage of this arrangement is that the input-output pads of the semiconductor element will coincide directly with those of the base plate and that soldered connection wires are avoided.

The invention is applicable, for example, in the realisation of housings for microwave circuits, in the range from 10 to 120 GHz.

BACKGROUND OF THE INVENTION

A semiconductor device as described in the opening paragraph is known from a prior-art document, a European Patent Application published under no. EP 0 469 614 A1.

The known device comprises a semiconductor element formed by a substrate with an active front surface carrying an integrated circuit (or chip). This active surface also carries a plurality of contact pads for the input-output of the integrated circuit. This device in addition comprises a base plate formed by a substrate with a front surface which serves to support the semiconductor element and which for this purpose carries a plurality of contact pads. According to the cited document, this semiconductor element is turned over (or flipped) with its active surface towards the front surface of the base plate in order to connect the semiconductor element electrically to the base plate, and the patterns of the contact pads of the two mutually facing surfaces are provided so as to coincide. When the pads of the active surface of the flipped-over semiconductor element coincide with the pads of the front surface of the base plate, sealing means are provided so as to obtain the electrical connection between the respective contact pads of the semiconductor element and the base plate.

In the field of microwave ranges, it is necessary first of all to realise that all connections are transmission lines. The problem thus arises in a given circuit of how to integrate the active elements (transistors and diodes) and passive elements (resistors, capacitors, self-inductances, and microwave transmission lines) on one and the same chip. In this frequency range, on the other hand, it has proved necessary to integrate one or several purely passive circuits formed by transmission lines with the active circuit on the same chip, both for technical reasons and for economic reasons. These passive circuits have considerable dimensions. At 12 GHz, for example, such a circuit of the 90° or 180° phase shifter type will have transmission line elements of dimensions greater than one quarter of the length of the guided wave, which is thus 9 mm or 2.25 mm. The use of such passive elements in association with active elements thus leads to surface areas of integrated circuits which are not compatible with the surface areas of the substrates available in production, or which do not have a sufficiently low cost for obtaining industrially competitive devices.

The microwave circuits which comprise several subassemblies integrated on one and the same chip are called monolithic circuits (or MMICs=Monolithic Microwave Integrated Circuits). This monolithic integration is often difficult for various reasons as explained here.

In the microwave range, several other problems relating to the monolithic integration arise in addition to the surface problem indicated above.

One of these problems concerns the frequency limitation which arises when the transmission lines are subject to the influence of undesirable elements. These undesirable elements which disturb the propagation conditions for the millimeter-range waves in the lines may be formed in particular by the proximity of the plane of dielectric material of the front surface of the base plate upon the fixation of the semiconductor element on the latter, or alternatively by the proximity of the fixation material itself, owing to the fact that the circuit of lines is arranged so as to face this front surface; or alternatively by the proximity of other subassemblies of the monolithic circuit. The arrangement of transmission lines close to a dielectric which is alien to their structure, or to a radiating element, is to be avoided for all circuits of which the signals are very sensitive to dimensions and structures of the lines. This is particularly the case for the 90° phase shifting circuits or 180° phase shifting circuits mentioned above.

Another such problem relates to the frequency limitation which arises when there are discontinuities in the ground connections.

Another such problem relates to the appearance of parasitic capacitances when the connections between the microwave conductors are imperfect.

SUMMARY OF THE INVENTION

It is an object of the invention, accordingly, to provide a microwave device which has besides an integrated circuit for microwave frequency ranges formed on an active surface of a chip at least also one passive circuit of microwave lines, and without increasing the surface area of the substrate necessary for realizing the chip.

Another object of the invention is to provide such a device in which the circuit is free from discontinuities in the ground connection.

These objects are achieved with a semiconductor device as defined in the opening paragraph which is in addition characterized in that:

- the semiconductor element comprises on the one hand a circuit of transmission lines of the coplanar type whose conductor strips and ground metallizations are disposed on the active surface, and on the other hand a circuit of transmission lines of the microstrip type whose conductor strips are disposed on the surface opposed to the active surface and whose ground metallizations are formed by the ground metallizations of the active surface, the base plate in addition comprises ground metallizations patterned so as to be in electrical contact with the ground metallizations of the active surface of the semiconductor element upon the fixation of the latter on the base plate. In one advantageous embodiment of the invention, the ground metallizations on the active surface of the semiconductor element occupy the entire free surface area outside of the area occupied by the conductors and the active elements and any resistors and/or capacitors and inductances.

An advantage of the device according to the invention lies in the fact that the dimensions of the substrate necessary for realizing an microwave monolithic circuit comprising active circuit regions and passive circuit regions of great surface area can be halved compared with the dimensions which would be necessary if the prior-art method were used. The realisation of a monolithic integrated circuit is thus facilitated.

Another advantage lies in the fact that the regions of the passive circuits where the propagation takes place for the major part and which are sensitive to interferences generated by the fixation of the semiconductor element on the base plate may be realised on the surface opposed to the active surface. These interferences are thus avoided and the performance of the monolithic circuit is improved.

Another advantage lies in the fact that there are no discontinuities in the ground planes: on the semiconductor element, both surfaces share the same ground planes; and during the fixation of the semiconductor element on the base plate, the ground planes of the former are set against the ground planes of the latter, which are opposite thereto, and are electrically connected. This is again a circumstance which improves the performance of the monolithic circuit.

It is another object of the invention to provide a microwave device in which the parasitic capacitances caused by the imperfection of the ultra-high frequency connections are reduced.

For this purpose, in an embodiment, this semiconductor device is characterized in that the semiconductor element comprises metallized holes for connecting the circuits and/or contact pads of the active surface to the circuit of the opposed surface.

An advantage of this embodiment is that it is not necessary to use thin soldered metal wires, which are generally known to those skilled in the art, for realising microwave frequency connections. These thin wires generate parasitic capacitances. Thus, according to the invention, a circuit may be realised on the surface opposed to the fixation surface without losing the advantage of the "flip chip" technology. This again improves the performance of the monolithic circuit.

BRIEF DESCRIPTION OF THE DRAWINGS

The invention will be described in detail below with reference to the attached diagrammatic Figures, in which.

DESCRIPTION OF THE PREFERRED EMBODIMENTS

Figure 1A:
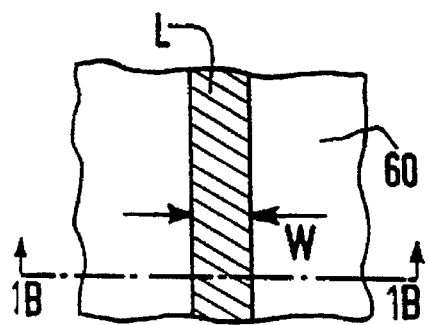
FIG. 1A is a plan view of a transmission line of an integrated circuit in the microstrip technology.

The demand for integrated circuits operating at ever increasing frequencies renders it necessary to resolve the problems connected with the encapsulation of these circuits. Problems arise in integrated monolithic circuits in which some sub-assemblies have operating frequencies as high as 10–120 GHz which do not arise in the cited prior-art where the operating frequencies were 2 GHz.

Generally, the problems in the field where high frequencies are aimed at are related to imperfections in connections which create ground discontinuities or discontinuities in the propagation mode of the waves, and which thus limit the operating frequencies to values lower than those envisaged.

To reduce these connection problems as much as possible, it has proved necessary to integrate several sub-assemblies of a circuit on one and the same chip in a monolithic manner. These sub-assemblies operate at different frequencies, sometimes with different DC supplies, and are realised by different technologies.

The invention proposes means for realising these monolithic circuits which render it possible to save surface area on the substrate and which take into account the particular problems in the microwave field, i.e. the frequency limitations due to connections, the difficulties related to differences in technology for realising the sub-assemblies, and the encapsulation problems.

According to the invention, the following are provided in a microwave semiconductor device:

a semiconductor element 1 of the "flip chip" type which comprises a semiconductor substrate of which an active surface 1a has an integrated circuit 200 with at least one active element T and a plurality of metal input-output pads 101a, 102a, 301a, 202a, a base plate 2 comprising an insulating substrate of which a front surface 2a has a plurality of metal input-output pads 101c, 102c, 301c, 202c, and means for fixation of the active surface 1a of the semiconductor element on the front surface 2a of the base plate, with the corresponding input-output pads in electrical contact with one another, i.e. 101a–101c; 102a–102c; 301a–301c; 202a–202c; while it is in addition provided that:

the semiconductor element 1 comprises on the one hand a circuit 200, 300 of transmission lines of the coplanar type L1, L2, L3, 1 whose conductor strips and ground metallizations M11, M12 are arranged together with the active element(s) on the active surface 1a, and on the other hand a circuit 100 of transmission lines of the microstrip type 110, 111, 112, 113, whose conductor strips are disposed on the surface 1b opposed to the active surface and whose ground metallizations M11, M12 are formed by those of the active surface 1a; and the base plate in addition comprises on its front surface 2a ground metallizations M13 patterned so as to be in electrical contact with the ground metallizations M11, M12 of the active surface 1a of the semiconductor element 1 upon the fixation of the latter on the base plate 2.

Example of an embodiment

Figure 3B:
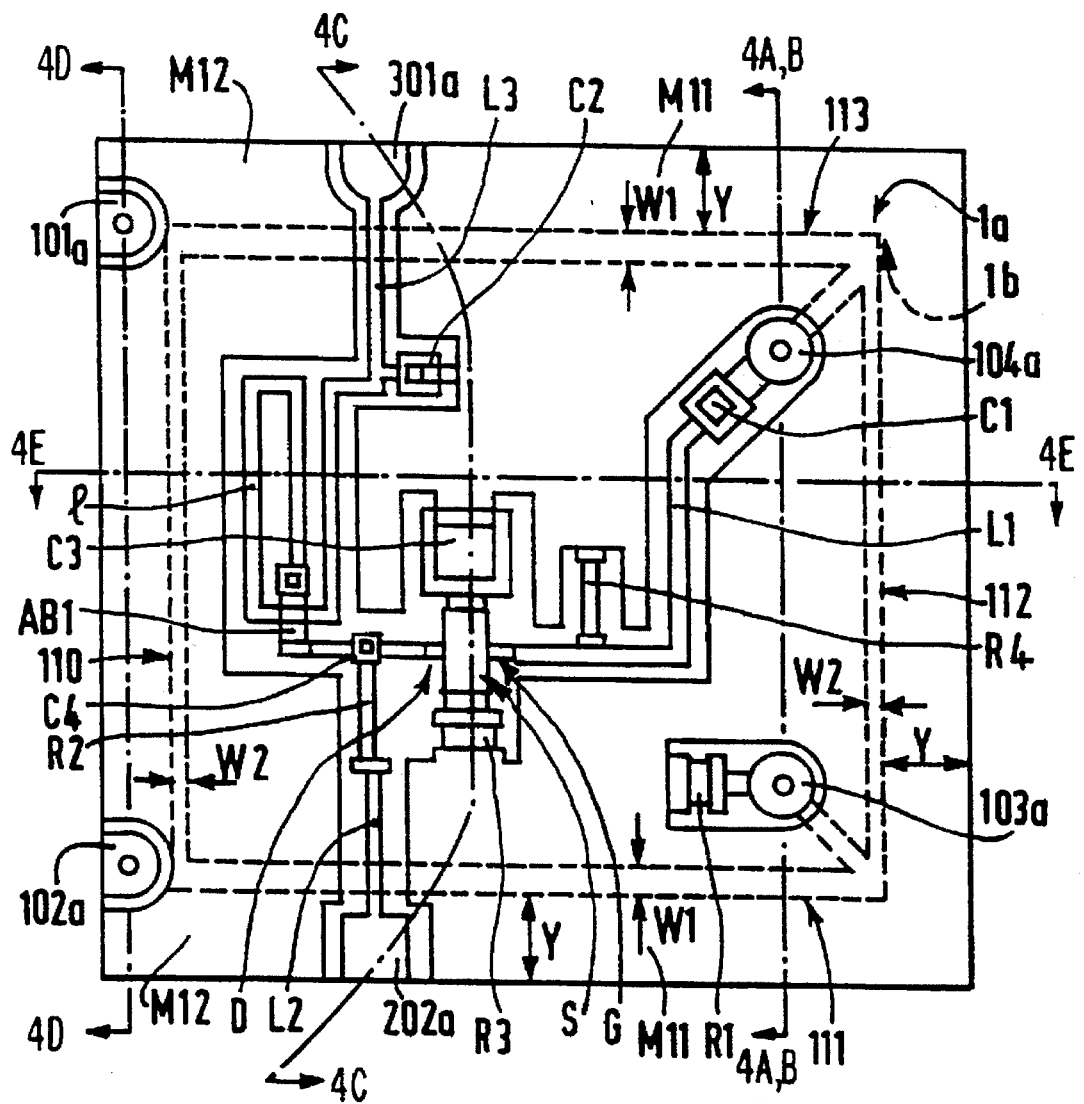
FIG. 3B is a plan view of an embodiment of the circuit according to FIG. 3A with the active sub-assembly and a passive sub-assembly disposed on the active surface of the semiconductor element, and with a second passive sub-assembly realised on the opposing surface.
Figure 3C:
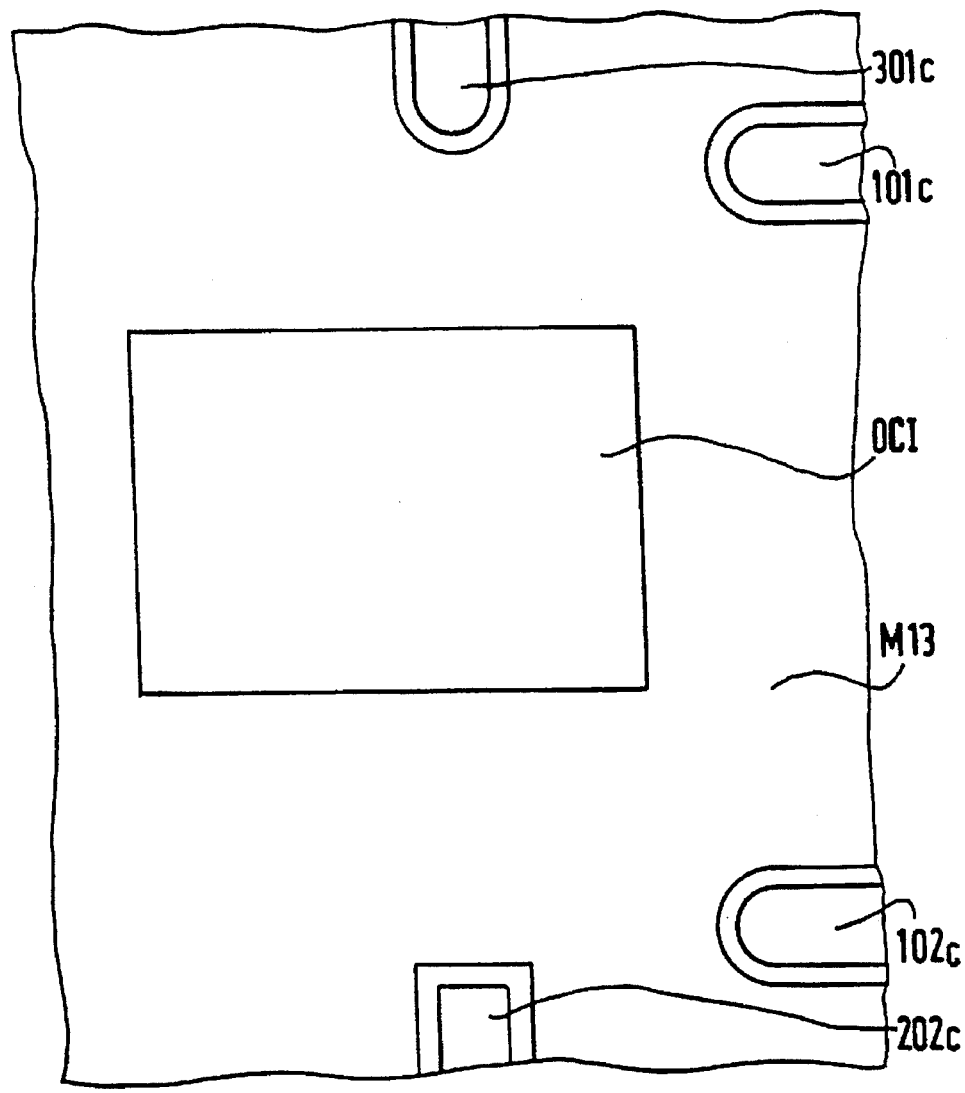
FIG. 3C is a plan view of an example of a circuit which can be realised on the front surface of the base plate for receiving the semiconductor element of FIG. 3B.
Figure 3A:
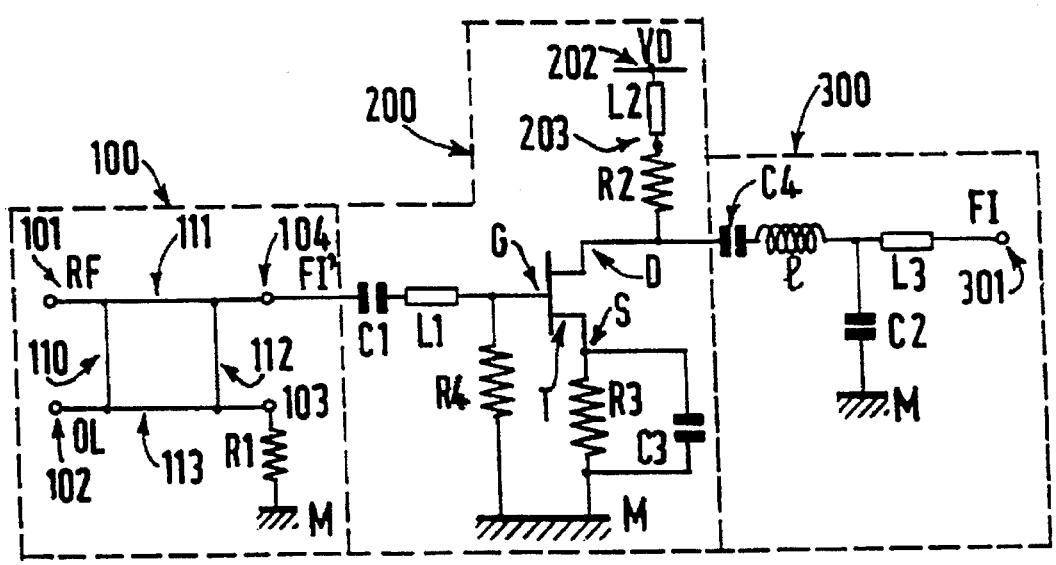
FIG. 3A shows an example of a microwave circuit which can be monolithically realised in a device according to the invention.

In antenna reception modules for the reception of emissions from an artificial satellite operating in the 11.7 to 12.2 GHz band, it is possible to realise a circuit of the type as represented in FIG. 3A. This circuit is a simple mixer with two inputs 101, 102, one 101 for the radio frequency signal RF, the other 102 for the signal of a local oscillator OL, and having one output 301 at the intermediate frequency FI =RF–OL. This circuit comprises a first sub-assembly 100 which is purely passive and which forms a branch coupler 0°–90° provided with two inputs 101,102 for the two signals to be mixed, RF and OL, and with an output 104 for a mixed signal FT. This sub-assembly 100 is entirely formed by transmission lines 110, 111, 112, 113. The circuit mixer of FIG. 3A also comprises a second, active sub-assembly 200 formed by at least one transistor T and resistance elements R2, R3, R4, capacitors C1, C3 and inductance L2 to optimize the signal provided by the output 104 of the branch coupler 100.

At the operating frequency of the branch coupler, i.e. 12 GHz, which corresponds to a wavelength of the guided wave of 9 mm, the length of the branches 110, 111, 112, 113 of the coupler is of the order of 2.5 mm. This passive sub-assembly 100, accordingly, occupies very much surface space. Moreover, it is much more sensitive to interferences due to structural faults than is the second, active sub-assembly 200. Until today, therefore, it has been common practice to realise the different microwave sub-assemblies on different chips. Thus, a complete antenna reception head could comprise up to 5 or 6 different chips. The problems then arose again of the microwave connections and the ground connections between these various chips. This is why it became necessary to integrate the greatest possible number of sub-assemblies of the circuits on one and the same chip, especially the sub-assemblies which operate at the highest frequencies.

The problem then lies in the dimensions of the semiconductor substrates for microwave ranges available on the market, and in the cost thereof. Consumer applications require low costs and thus lead to the realisation of a maximum number of elements per unit surface of the substrate, i.e. the maximum number of sub-assemblies per chip of standard surface area.

In the active circuit 200 of FIG. 3A, the output signal FT is applied to the gate G of the transistor T which is biased so as to provide the signal FI at the intermediate frequency RF–OL at the output 301. These biasing means comprise:

biasing of the gate G relative to ground, for example with a line L1 and a resistor R4, biasing of the source S relative to ground, for example, with a resistor R3 and a capacitor C3, a polarization of the drain D relative to a DC supply VD, for example, with a resistor R2 and a line L2.

The mixer circuit of FIG. 3A further comprises a passive filter 300 which includes, for example, a self-inductance l, a capacitor C2 and a line L3.

The various sub-assemblies 100, 200, 300 are interconnected through coupling capacitors C1, C4.

These various sub-assemblies must be realised in a monolithic manner on a semiconductor substrate which should be provided with encapsulation means.

With reference to FIGS. 3B, 3C and to the assembly of FIGS. 4, a semiconductor device for accommodating such a circuit formed by monolithically integrated sub-assemblies comprises the following main elements:

a semiconductor element 1 formed by a substrate with an active surface 1a carrying the integrated microwave circuit 200, 300 and comprising a plurality of microwave metal input-output pads 101a, 102a, 301a, ground metallizations M11, M12, and a DC supply pad 202a, a base plate 2 formed by a substrate with a front surface 2a supporting the semiconductor element 1, which front surface carries a plurality of microwave metal pads 101c, 102c, 301c corresponding to the microwave input-output pads 101a, 102a, 301a of the integrated circuit, and a DC supply connection 202c, and sealing means for sealing the semiconductor element 1 with its active surface 1a on the support surface 2a of the base plate 2 with electrical connection of the corresponding conductors.

According to the invention, it is taken into account that, with microwave ranges, an integrated circuit such as the circuit 200, 300 in FIG. 3A renders necessary the realisation of transmission lines L1, L2, L3 and self-inductances l, and that generally all conductors for alternating signals in this frequency range must have the structure of a transmission line.

According to the invention, the transmission lines L1, L2, L3 and self-inductances l associated with the active circuit are realized in the coplanar technology on the active surface 1a of the said semiconductor element.

Figure 2A:
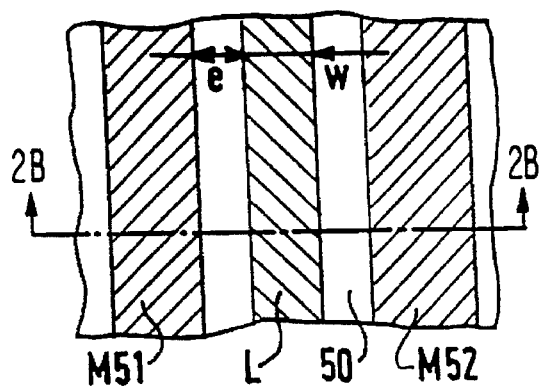
FIG. 2A is a plan view of a transmission line of an integrated circuit in the coplanar technology.
Figure 2B:
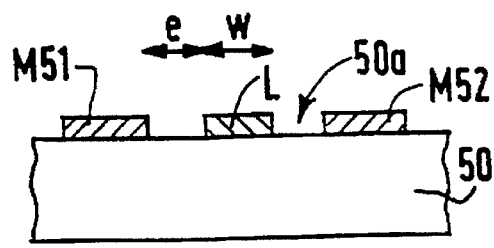
FIG. 2B is a cross-sectional view of this transmission line taken on B—B.

In FIGS. 2A and 2B, the circuits realized in the coplanar technology comprise a dielectric or semi-insulating substrate 50, and the transmission lines are realised on a surface, of this substrate called front surface 50a, by means of conductor strips L having a width W and arranged at a distance e from ground metallizations M51, M52. Each line may comprise a single ground metallization at the distance e, or alternatively two ground metallizations at the distance e on either side of the central conductor L. The microwave propagation mode in the line thus formed is a function of this coplanar assembly. The characteristic impedance of the line is determined by the dimension W of the central conductor, the distance e, and the permeability and the dielectric constant ($\mu$ and $\epsilon$, respectively) of the substrate 50 between the conductor L and the ground metallization M51, M52.

In FIG. 3B, this coplanar technology is applied to the realisation, on the active surface 1a of the semiconductor element 1, also of the transistor(s) T and resistive biasing elements R2, R3, R4 and capacitances C1, C2, C3, C4, of line elements and of self-inductances such as the elements L1, L2, L3 and l of the circuit of FIG. 3A.

FIG. 3B shows in plan view the active surface 1a of a semiconductor element 1 provided with the sub-assemblies of the integrated circuit 200 and the filter 300, shown in fully drawn lines, corresponding to the circuit diagram of FIG. 3A.

The arrangement of the elements shown in FIG. 3B is given purely by way of example, as is the circuit arrangement of FIG. 3A. This representation of the active elements, resistors, capacitors, and self-inductances shows that the ground metallizations M11, M12 of the transmission lines L1, L2, L3 and the self-inductance l cover substantially the entire area of the active surface 1a left free by these elements, while maintaining the distance e2 between the microwave conductors and the ground metallizations M11, M12 in conformity with the propagation rules for microwave ranges.

The elements of the sub-assemblies 200, 300 of the circuit of FIG. 3A are visible in FIG. 3B:

for the sub-assembly 200: the transistor T with its source S, its drain D, its gate G; the lines L1, L2; the resistors R2, R3 and R4; and the capacitors C1 and C3;

for the sub-assembly 300: the capacitors C2 and C4; the self-inductance l and the line L3.

The active surface 1a is in addition provided with a metal pad 301a, for the output FI of the mixer, with a metal pad 104a for the input FT corresponding to the output of the coupler 100 and to the input of the sub-assembly 200, with a metal pad 202a for applying the DC supply voltage to the active circuit 200.

According to the invention, the means for saving a considerable substrate surface area in the realisation of the monolithic integrated device consist in the realisation of the passive sub-assemblies, such as 100, which are mainly formed by transmission lines such as 110, 111, 112, 113, on the surface 1b of the substrate 1 which is opposed to the active surface 1a. These sub-assemblies of the non-active surface 1b are realised in the microstrip technology and use the ground planes M11, M12 of the coplanar lines of the active side as their ground planes.

In the mixer circuit of FIG. 3B which is described by way of example, the sub-assembly 100 will thus be realised on the surface 1b or non-active surface of the substrate 1. To this end, the line sections 110, 111,112, 113 are realised in the so-called microstrip technology.

Accordingly, there are exclusively metallized strips on this non-active surface 1b; whereas active elements T are found on the active surface, realised in active zones AZ formed in the substrate through epitaxy or implantation, as well as air bridges AB and metallized ribbons for forming the lines; to which are added the resistors and capacitors having several deposition levels.

Figure 1B:
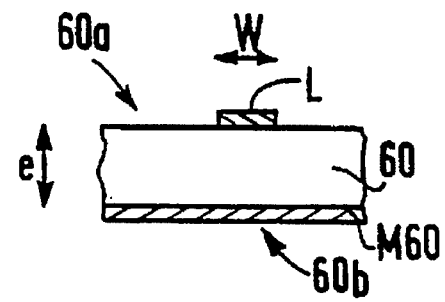
FIG. 1B is a cross-sectional view of this transmission line taken on B—B.

With reference to FIGS. 1A and 1B, the circuits realised in the microstrip technology comprise a dielectric or semi-insulating substrate 60 of a given thickness e; and the microwave transmission lines comprise conductors L in the form of strips of a width W on the front surface 60a of the substrate 60, and a ground plane M60 on the rear surface 60b of the substrate 60. The propagation mode in these microstrip lines is a function of the dimension W of the upper conductor, of the width e, and of the permeabilities and dielectric constant $\mu$ and $\epsilon$, respectively, of the substrate 60 present between the conductor L and the ground metallization M60.

FIG. 3B shows, by way of example and in broken lines, an embodiment of the coupler 100 provided on the non-active surface 1b. In this example, the coupler comprises four microstrip conductors 110, 111, 112, 113; a metal pad 101b for the input of the signal RF, a metal pad 102b for the input of the signal OL, a metal pad 104b for the output of the signal FT, and a metal pad 103i b 1 for the connection to a resistor R3 which connects this pad to ground.

The lines 110, 111,112, 113 are divided into four branches forming a quadrangular shape. The inputs are applied to the ends 101b, 102b of the two parallel lines 111 and 113, respectively, and the alternate output FT is available at the end 104bof one of these lines, for example 111 (if the other end 10lb is connected to RF). The end of the line 113 opposite to OL is then connected to ground through a resistor R1 via a metal pad 103b. The resistor R1, which has several deposition levels, is itself realised on the active surface 1a.

The lines 110, 111, 112, 113 of the surface 1b opposed to the active surface, which are of the microstrip type, utilize the ground planes M11, M12 realised on the active surface 1a which are at the same time the ground planes of the coplanar lines L1, L2, L3 and l of the active surface.

Thus, sub-assemblies of large surface area such as the passive microwave sub-assembly 100 is realised monolithically with the sub-assemblies 200, 300 with a saving of half the surface area of the substrate which would have been necessary if the prior-art technology were used. Moreover, problems with ground interconnections are avoided because all sub-assemblies have the same ground. The technology for realising the sub-assembly 100 on this opposite surface 1b does not create any problems because the constituent lines are simple metal strips. All elements which require a more complicated technology (active elements, resistors, capacitors, air bridges) are realised in conventional manner on the active surface 1a.

To transfer the microwave signals from the non-active side 1b to the active side 1a, without parasitic capacitances arising as a result, a technology of metallized holes or alternatively of metal pillars is used.

In FIGS. 4A, 4B, 4C, 4D, 4E, which are cross-sections through FIGS. 3B, 3C taken on different lines I—I, J—J, K—K, H—H, the microwave signals are transferred through metallized holes or metal pillars. Thus the metallized holes 11, 12, 13, 14 are in connection with the microwave pads 101a–101b; 102a–102b; 103a–103b; 104a–104b, respectively, through the substrate of the semiconductor element.

According to the invention, furthermore, the means for realising the electrical connection between the corresponding conductors of the semiconductor element and the base plate, and for achieving the sealing of the semiconductor element on the support surface of the base plate under conditions suitable for operation at the envisaged microwave ranges (10 to 120 GHz), have the following characteristics:

as can be seen in FIG. 3B, the semiconductor element 1 comprises the microwave contact pads 101a, 102a, 301a, and the ground planes M11, M12 realised on the active surface 1a of its substrate, the latter favourably being semi-insulating for a suitable realisation of the active element T; and this active surface 1a also comprises the pad 202a for receiving the DC supply voltage;

as can be seen in FIG. 3C, the base plate 2 comprises a ground plane M13 arranged on its support surface 2a, with microwave pads 101c, 102c, 301c and the DC supply voltage input 202c in accordance with a pattern such that these pads and ground planes coincide with and are in electrical contact with the respective pads and ground planes of the active surface 1a when the semiconductor element is "turned over" on the base plate.

Thus the ground plane M13 of the surface 2a of the base plate coincides with the ground planes M11, M12 of the active surface 1a of the semiconductor element 1 and renders possible a perfect ground connection; the microwave pads 101a–101c; 102a–102c; 301a–301c coincide; and the DC voltage pads 202a–202c; also coincide.

The connection means for fixing the active surface 1a of the semiconductor element on the front surface 2a of the base plate may be any conductive soldering or gluing means known to those skilled in the field of microwave integrated circuits.

The semiconductor element 1 is thus sealed by one of these means on the base plate in this position of coincidence whereby the direct electrical connection is facilitated.

Figure 4A:
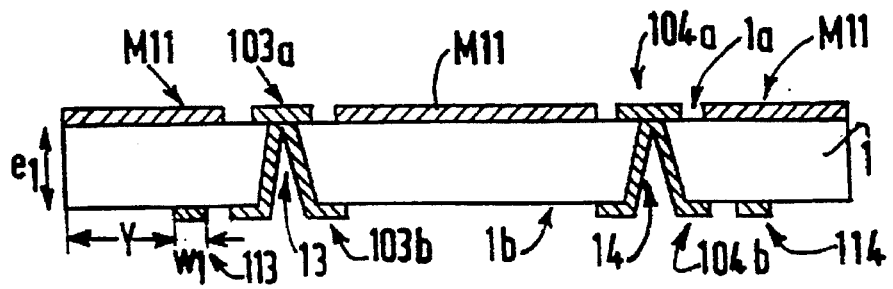
FIG. 4A shows the semiconductor element of the device of FIG. 3B in cross-section taken on I—I.

FIG. 4A is a cross-section of FIG. 3B taken on the line I—I. This Figure shows the active surface 1a as the upper surface of the semiconductor element 1. On this active surface 1a are visible the ground planes M11 and the microwave pads 103a, 104a. Furthermore, on the lower, non-active surface 1b, is shown the microwave microstrip lines 113, 114 which utilize M11 as their ground plane; and also the microwave pads 103b, 104b connected to the pads 103a, 104a of the active surface through metallized holes 13 and 14, respectively.

Figure 4B:
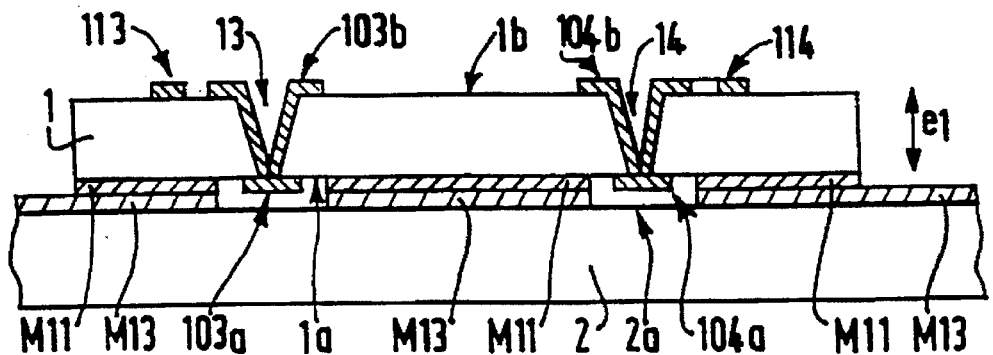
FIG. 4B shows the device of FIG. 3B in cross-section taken on I—I in which the semiconductor element of FIG. 4A is mounted on the base plate with its active surface turned over so as to face the front of the base plate.

FIG. 4B is a cross-section in FIGS. 3B–3C taken on the line I—I. In this FIG. 4B, the semiconductor element 1 is turned over so that its active surface 1a lies against the front surface 2a of the base plate 2. The non-active surface 1b is now the upper surface of the semiconductor device formed by sealing of the element 1 on the base plate 2. The result is that the lines 110, 111, 112, 113, in which the major part of the microwave propagation takes place, are not subject to adverse influences. In this FIG. 4B, the ground planes M11 and M13 of the active surface 1a and of the front surface 2a are seen to coincide. By contrast, the microwave pads 103a and 104a, which are not input-output pads, preferably face an air layer by way of dielectric.

Figure 4C:
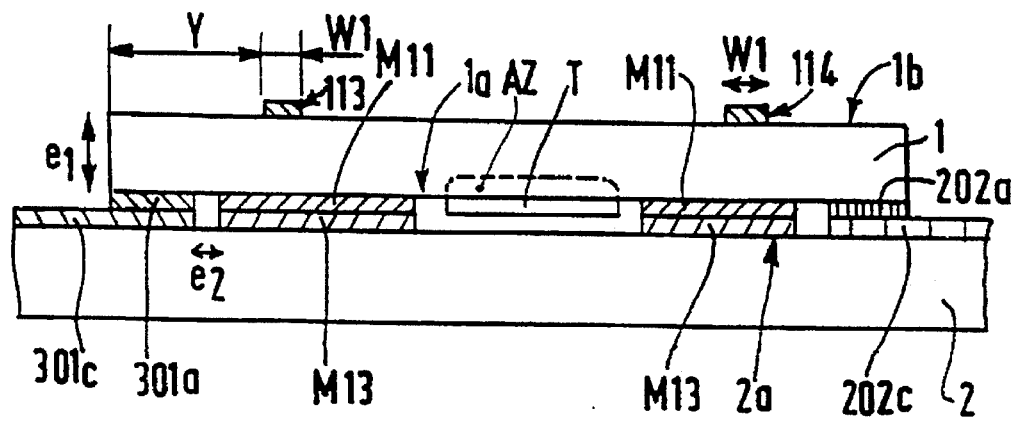
FIG. 4C shows the device of FIG. 3B in cross-section taken on J—J in which the semiconductor element is mounted on the base plate with its active surface turned towards the front surface of the base plate.
Figure 4D:
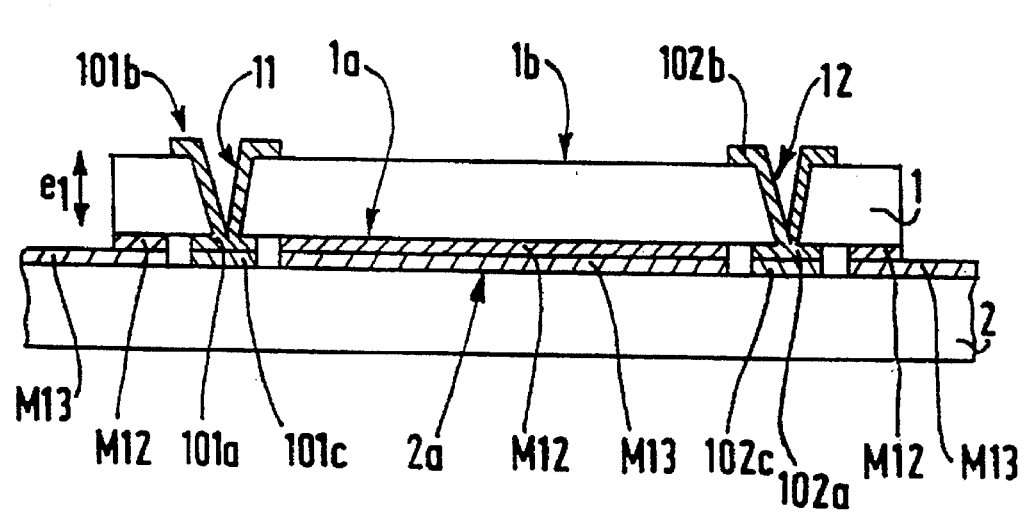
FIG. 4D shows the device of FIG. 3B in cross-section taken on K—K in which the semiconductor element is mounted on the base plate with its active surface turned towards the front of the base plate.
Figure 4E:
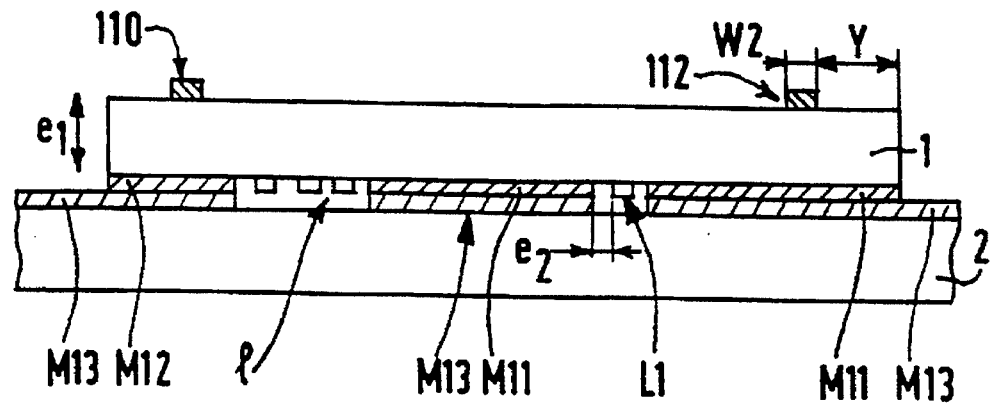
FIG. 4E is a view similar to those of FIGS. 4C and D in cross-section taken on H—H.

FIGS. 4C, 4D, 4E are cross-sections again with the semiconductor element 1 turned over onto the base plate 2. In FIG. 4C, a cross-section taken on J—J, the microstrip lines 113 and 114 with a width W1 are visible on the surface 1b which is now the upper surface of the device, with the corresponding ground plane M11 situated on the active surface 1a at the distance e1 corresponding to the thickness of the substrate of the semiconductor dement. During the assembly of the element 1 with the base plate 2, the ground planes M11 and M13 will coincide. The transistor T is visible, realised in an active zone AZ of the semiconductor substrate, which may in addition be arranged opposite a void OCI formed in the front surface 2a of the base plate. Such voids may also be formed in the front surface of the base plate opposite each unconnected microwave line or pad, such as L1, 1, or 103a, 104a. FIG. 4C also shows the microwave pad 301a, of the active surface 1a coinciding with the microwave pad 301c of the base plate.

In FIG. 3C, which shows the base plate viewed from above, the microwave output pad or lines 300c is realised in the coplanar technology (see FIGS. 2A, 2B), as are the microwave input pads or lines 101c, 102c. To this end, the ribbons forming these lines are spaced apart from the ground planes M11, M12, M13 by a distance e2.

In FIG. 4C, the DC supply pad 202a of the active surface 1a is also visible, coinciding with the DC voltage pad or line 202c; of the base plate 2.

In FIG. 4D, a cross-section taken on K—K, the ground plane M12 of the active surface 1a is visible, coinciding with the ground plane M13 of the front surface 2a. Also visible are the microwave input pads 101b, 102b realised on the non-active surface 1b and connected to microwave input pads 101a, 102a of the active surface 1a through metallized holes 11 and 12. The microwave input pads 101a, 102a coincide with the HF pads of line 101c, 102c of the front surface of the base plate.

In FIG. 4E, the microwave lines 110, 112 realised in the microstrip technology with a width W2 on the non-active surface 1b are shown, having as their ground planes M11, M12 formed on the active surface 1a. Also visible are the lines L1 and 1 realised on the active surface 1a in the coplanar technology, having these same ground planes M11, M12. The lines L1, or 1, are separated from the coplanar ground planes by a distance e2. In FIG. 4E, the ground planes M11, M12 are visible as coinciding with the ground planes M13 of the base plate. The lines L1 and 1 are opposite an air layer.

Possibly, passive elements of large dimensions, for example, decoupling capacitors, may be fixed on the base plate, which may also comprise a circuit of coplanar lines which is more complicated than that of FIG. 3C.

In particular, a decoupling capacitor may thus be provided between the junction 203 and the ground of the circuit of FIG. 3A.

In an embodiment of the circuit of FIG. 3A in accordance with the above description, the dimensions for operation at 12 GHz may be as follows:

thickness of substrate e1=100 µm width of the lines 111, 113, W1=150 µm length of the lines 111, 113=2120 µm width of the lines 110, 112, W2=75 µm length of the lines 110, 112=2170 µm distance Y from a line to the edge of the subjacent ground M11, M12=greater than the width of the line in question.

Dimension of a metallized hole 11, 12, 13 or 14 on the non-active surface 1b =approximately 100 µm values of the circuit elements:

R1=50Ω

R2=100Ω(bias resistance)

R3=300Ω(bias resistance)

R4=1000Ω(bias resistance)

C1=5 pF (input connection capacitance)

C2=1 pF (filtering capacitance of signal OL)

C3=10 pF (microwave recoupling capacitance of the resistor R3)

C4=5 pF (output connection capacitance)

L1, L2, L3=microwave lines of high characteristic impedance), Zc=90 Ω.

The impedance of these microwave lines L1, L2, L3 is characterized by the ratio W/W+2(e2), where W is the width of the ribbon forming these lines and e2 is the distance to the adjacent ground plane M11, M12. In the example chosen, e2=100 µm.

This ratio, combined with the thickness of the substrate e1=100 µm, and with the permittivity relative to this substrate, ($\epsilon$ r=12.8 when the substrate is made of gallium arsenide (GaAs), renders it possible to obtain the characteristic impedance of the microwave lines of the coplanar type.

The result is that:

the length of line L1=1.5 mm the length of line L2=0.5 mm
the length of line L3=0.5 min.

In the circuit example shown in FIG. 3A, there is also a "local" element formed by a self-inductance l of the coil type with a level change brought about by an air bridge AB. This coil inductance has a width of 5 μm with an intercoil space of 10 μm.

The adaptation to 50Ω of the input FI is thus realised by this inductance in association with the capacitance C2) of a value 4 nH.

I claim:

1. A semiconductor device for microwave frequency ranges comprising:
    a semiconductor element of the "flip chip" type which comprises a semiconductor substrate of which an active surface has at least one integrated circuit and a plurality of metal input-output pads,
    a base plate which comprises an insulating substrate of which a front surface has a plurality of metal input-output pads,
    and means for fixing the active surface of the semiconductor element on the front surface of the base plate with the corresponding input-output pads in electrical contact with one another, wherein
    the semiconductor element comprises a circuit of transmission lines of the coplanar type having conductor strips and ground metallizations disposed on the active surface, and a circuit of transmission lines of the microstrip type having conductor strips disposed on a surface opposed to the active surface and whose ground metallizations comprise the ground metallizations of the active surface, and
    the base plate comprises ground metallization on its front surface patterned so as to be in electrical contact with the ground metallizations of the active surface of the semiconductor element.

2. A semiconductor device as claimed in claim 1, wherein the semiconductor element further comprises metallized holes for connecting the circuits and/or contact pads of the active surface to the circuit disposed on the surface opposed to the active surface.

3. A semiconductor device as claimed in claim 1, wherein the integrated circuit forming a part of the active surface of the semiconductor element comprises at least one active element.

4. A semiconductor device as claimed in claim 3, wherein the integrated circuit forming a part of the active surface of the semiconductor element comprises resistance and/or capacitor elements and inductances.

5. A semiconductor device as claimed in claim 4, wherein the ground metallizations on the active surface of the semiconductor element occupy an entire free surface area outside of an area occupied by the conductors and the active elements, and any resistors and/or capacitors and inductances, and the ground metallizations on the front surface of the base plate occupy at least an identical surface area opposite thereto.

6. A device as claimed in claim 1, wherein the front surface of the base plate comprises a circuit of metallized tracks connected to metal input-output pads.

7. A device as claimed in claim 6, wherein discrete components are connected to the circuit of metallized tracks of the base plate.

8. A device as claimed in claim 7, wherein some of the discrete components are also connected to circuit elements of the surface opposed to the active surface of the semiconductor element.

9. A device as claimed in claim 3, wherein the base plate comprises a cavity opposite active elements of the region of the integrated circuit on the active surface of the semiconductor element, said cavity being present between the ground metallizations and input-output pads.

10. A device as claimed in claim 1, wherein the circuit of microstrip lines arranged on the surface opposed to the active surface of the semiconductor element comprises a phase shifting circuit generating signals shifted by 90° or 180°.

11. The semiconductor device as claimed in claim 2 wherein the integrated circuit forming a part of the active surface of the semiconductor element comprises active elements.

12. The semiconductor device as claimed in claim 1 wherein the integrated circuit forming a part of the active surface of the semiconductor element comprises resistance and/or capacitor elements and inductances.

13. A high frequency semiconductor device comprising:
    a semiconductor element which comprises a semiconductor substrate having an active surface and a non-active opposed surface with the active surface including at least one integrated circuit with at least one active element, a plurality of metal input-output pads, and at least one coplanar type transmission line comprising a conductor strip and at least one adjacent metal ground conductor, and at least one microstrip type transmission line comprising a conductor strip disposed on the non-active surface and opposed to the metal ground conductor on the active surface whereby the metal ground conductor functions as a ground plane for both the coplanar type transmission line and for the microstrip type transmission line, and
    a base plate comprising an insulating substrate having a first surface juxtaposed to the active surface of the semiconductor element and having a plurality of metal input-output pads in electrical contact with corresponding metal input-output pads on the active surface of the semiconductor element and with a further metal ground conductor located so as to make electrical contact with the metal ground conductor on the active surface of the semiconductor element.

14. The high frequency semiconductor device as claimed in claim 13 wherein said semiconductor element and said base plate together form a cavity therebetween in the area of said active element.

15. The high frequency semiconductor device as claimed in claim 13 wherein said active element is a transistor and said integrated circuit further comprises a plurality of passive circuit elements interconnected by a plurality of microwave transmission lines of the coplanar type, and
    said non-active surface comprises a plurality of microstrip type transmission lines whose respective ground planes comprise the metal ground conductors on said active surface and which serve as the ground planes for said coplanar type microwave transmission lines.

16. The high frequency semiconductor device as claimed in claim 15 wherein at least one of said microwave transmission lines includes a conductor strip located in a cavity formed between the active surface of the semiconductor element and the first surface of the base plate.

17. The high frequency semiconductor device as claimed in claim 13 wherein said integrated circuit on the active surface is coupled to the conductor strip on the non-active surface via a metallized hole passing through the semiconductor substrate.

18. A semiconductor device as claimed in claim 1 wherein the semiconductor substrate forms the dielectric layer for the microstrip type circuit of transmission lines.

19. The high frequency semiconductor device as claimed in claim 13 wherein the semiconductor substrate forms the dielectric layer for the at least one microstrip type transmission line.

20. The high frequency semiconductor device as claimed in claim 13 wherein the semiconductor substrate forms the dielectric layer for the at least one microstrip type transmission line and for the at least one coplanar type transmission line.

* * * * *